US008030727B2

(12) United States Patent
Yun

(10) Patent No.: US 8,030,727 B2
(45) Date of Patent: Oct. 4, 2011

(54) IMAGE SENSOR AND METHOD FOR MANUFACTURING THE SAME

(75) Inventor: Ki-Jun Yun, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 102 days.

(21) Appl. No.: 12/643,443

(22) Filed: Dec. 21, 2009

(65) Prior Publication Data

US 2010/0164047 A1 Jul. 1, 2010

(30) Foreign Application Priority Data

Dec. 30, 2008 (KR) ........................ 10-2008-0136272

(51) Int. Cl.
*H01L 31/105* (2006.01)
*H01L 31/18* (2006.01)

(52) U.S. Cl. ......... 257/458; 257/E31.061; 257/E21.211; 438/98

(58) Field of Classification Search ................ 438/7, 48, 438/49, 57, 98; 257/233, 292, 293, 300, 257/458, E33.076, E33.077, E31.061, E31.058, 257/E31.081–E31.085, E31.121, E27.133–E27.163, 257/E25.032, E21.211
See application file for complete search history.

(56) References Cited

U.S. PATENT DOCUMENTS 7,309,865 B2 * 12/2007 Ikushima et al. .......... 250/338.1
2008/0083939 A1 * 4/2008 Guidash ........................ 257/292

* cited by examiner

*Primary Examiner* — Matthew W Such
*Assistant Examiner* — Monica D Harrison
(74) *Attorney, Agent, or Firm* — Sherr & Vaughn, PLLC

(57) ABSTRACT

An image sensor includes a semiconductor substrate, an interconnection and an interlayer dielectric, an image sensing device, a trench, a buffer layer, a barrier pattern, a via hole, and a metal contact. The semiconductor substrate includes a readout circuitry. The interconnection and an interlayer dielectric layer are formed on and/or over the semiconductor substrate while the interconnection is connected to the readout circuitry. The image sensing device may be formed on and/or over the interlayer dielectric and a trench may be formed in the image sensing device, the trench corresponding to the interconnection. The buffer layer may be formed on a sidewall of the trench. The barrier pattern may be formed on the buffer layer with the via hole penetrating through the image sensing device and the interlayer dielectric under the barrier pattern and exposing the interconnection. The metal contact may be formed in the via hole.

20 Claims, 6 Drawing Sheets

IMAGE SENSOR AND METHOD FOR MANUFACTURING THE SAME

Figure 1:
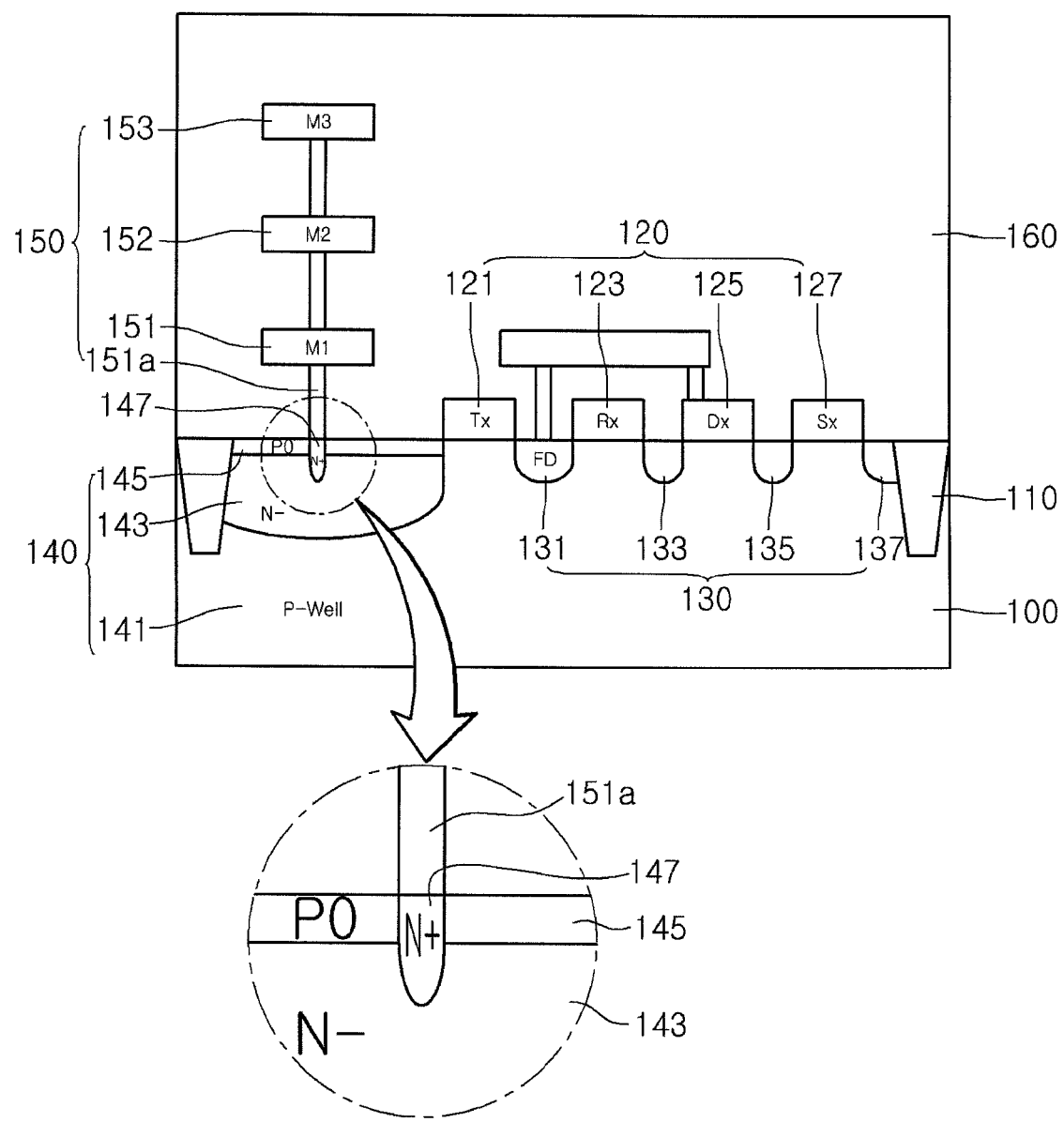
Figure 2:
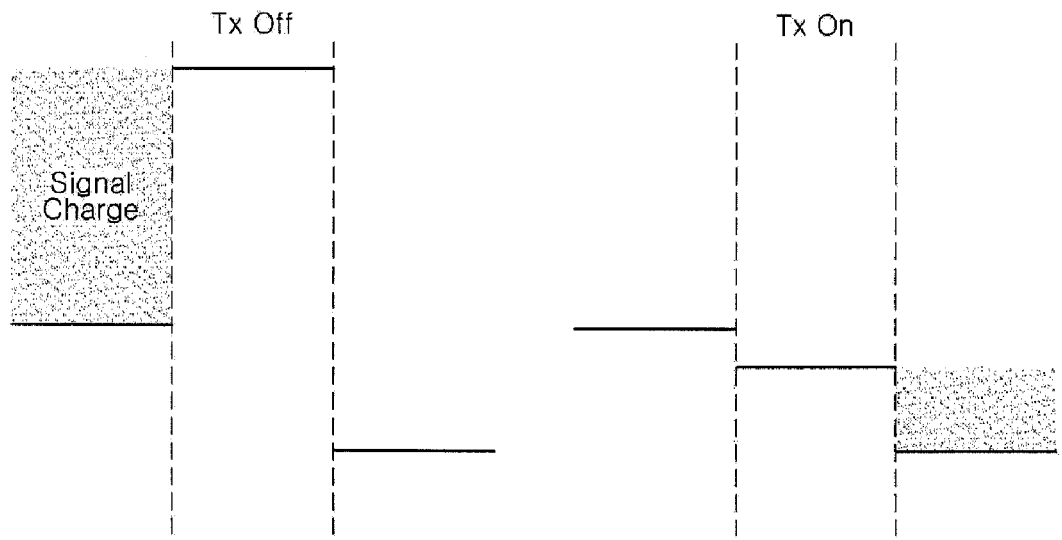

The present application claims priority under 35 U.S.C. 119 to Korean Patent Application No. 10-2008-0136272 (filed on Dec. 30, 2008), which is hereby incorporated by reference in its entirety.

BACKGROUND

Generally, image sensors are semiconductor devices that can convert optical images into electrical signals. Image sensors are roughly divided into charge coupled devices (CCDs) and complementary metal oxide semiconductor (CMOS) image sensors (CIS). CMOS image sensors may have a structure in which a photodiode region converting optical signals into electrical signals and a transistor region processing the electrical signals are horizontally disposed. In a horizontal type image sensor, since the photodiode region and the transistor region are horizontally disposed in a semiconductor substrate, there is a limitation in expanding an optical sensing part (referred to as "fill factor") within a limited area.

SUMMARY

Embodiments provide an image sensor and a method for manufacturing the same, which can provide vertical integration of a transistor circuit and a photodiode. According to embodiments, an image sensor can include: a semiconductor substrate including a readout circuitry; an interconnection and an interlayer dielectric layer on and/or over the semiconductor substrate, the interconnection being connected to the readout circuitry; an image sensing device on and/or over the interlayer dielectric; a trench in the image sensing device, the trench corresponding to the interconnection; a buffer layer on and/or over a sidewall of the trench; a barrier pattern on the buffer layer, the barrier pattern selectively exposing a bottom surface of the trench; a via hole penetrating through the image sensing device and the interlayer dielectric under the barrier pattern and exposing the interconnection; and a metal contact in the via hole.

According to embodiments, a method for manufacturing an image sensor includes: forming a readout circuitry in a semiconductor substrate; forming an interconnection and an interlayer dielectric on and/or over the semiconductor substrate, the interconnection being connected to the readout circuitry; forming an image sensing device on and/or over the interlayer dielectric; forming a mask on and/or over the image sensing device, the mask exposing the image sensing device corresponding to the interconnection; forming a trench in the image sensing device using the mask as an etch mask; forming a buffer layer on and/or over a sidewall of the trench using a polymer generated in the forming of the trench; forming a barrier pattern on and/or over the buffer layer; forming a via hole exposing the interconnection using the barrier pattern; and forming a metal contact in the via hole.

DRAWINGS

FIGS. 1 through 11 are cross-sectional views illustrating an example process for manufacturing an image sensor according to embodiments.

DESCRIPTION

Hereinafter, an image sensor and a method for manufacturing the same according to embodiments will be described in detail with reference to the accompanying drawings. Embodiments are not limited to a CMOS image sensor. For example, embodiments can be applied to all image sensors that use a photodiode such as a CCD image sensor.

Figure 11:
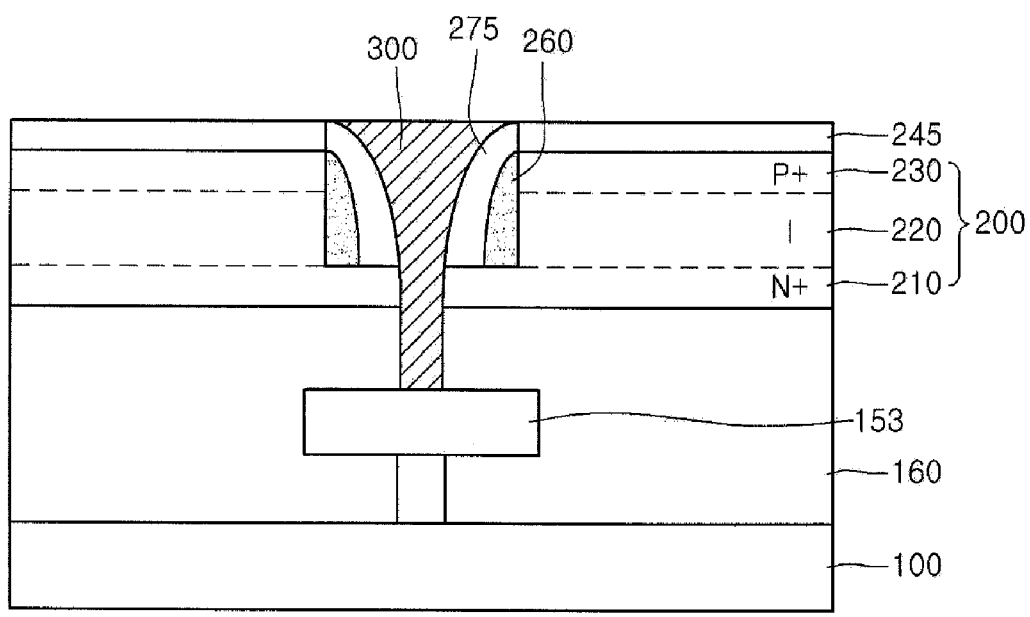

FIG. 11 is a cross-sectional view illustrating an image sensor according to embodiments. An image sensor according to embodiments may include a semiconductor substrate 100 comprising a readout circuitry 120, an interconnection 150 and an interlayer dielectric layer 160 on and/or over the semiconductor substrate 100, the interconnection 150 being connected to the readout circuitry 120, an image sensing device 200 on and/or over the interlayer dielectric 160, a trench 250 in the image sensing device 200, the trench 250 corresponding to the interconnection 150, a buffer layer 260 on a sidewall of the trench 250, a barrier pattern 275 on and/or over the buffer layer 260, the barrier pattern 275 selectively exposing a bottom surface of the trench 250, a via hole 285 penetrating through the image sensing device 200 and the interlayer dielectric 160 under the barrier pattern 275 and exposing the interconnection 150; and a metal contact 300 in the via hole 285.

The image sensing device 200 may include a first doped layer 210, an intrinsic layer 220, and a second doped layer 230 stacked therein. The bottom surface of the trench 250 may expose the first doped layer 210. The buffer layer 260 may be formed of a polymer. For example, the buffer layer 260 may be a polymer that is a by-product generated in an etching of the trench. The barrier pattern 275 may be formed of an Oxide-Nitride-Oxide (ONO) layer. Since the buffer layer 260 may be formed on the sidewall of the trench 250, an interface stress between the image sensing device 200 and the barrier pattern 275 is minimized, thereby improving electrical characteristics of a device.

Also, since the barrier pattern 275 may be formed only on the sidewall of the trench 250, a PIN isolation of the image sensing device 200 is enabled, thereby achieving normal signal outputs of photocharges.

Unexplained reference numerals of FIG. 11 will be described with reference to the accompanying drawings illustrating a method for manufacturing the image sensor below. Hereinafter, a method for manufacturing an image sensor according to embodiments will be described with reference to FIGS. 1 through 11.

Referring to FIG. 1, an interconnection 150 and an interlayer dielectric 160 are formed on and/or over a semiconductor substrate 100 including a readout circuitry 120. The semiconductor substrate 100 may be a mono- or poly-crystalline silicon substrate, and may be a substrate doped with P-type impurities or N-type impurities. For example, a device isolation layer 110 is formed in the semiconductor substrate 100 to define an active region. A readout circuit 120 including transistors for a unit pixel is formed in the active region. The readout circuit 120 may include a transfer transistor (Tx) 121, a reset transistor (Rx) 123, a drive transistor (Dx) 125, and a select transistor (Sx) 127. Thereafter, an ion implantation region 130 including a floating diffusion region (FD) 131 and source/drain regions 133, 135 and 137 for each transistor may be formed. The readout circuit 120 may also be applied to a 3Tr or 5Tr structure.

The forming of the readout circuitry 120 in the semiconductor substrate 100 may include forming the electrical junction region 140 in the first substrate 100 and forming a poly contact 147 connected to the interconnection 150 on the electrical junction region 140. For example, the electrical junction region 140 may be a P-N junction 140, but is not limited thereto. For example, the electrical junction region 140 may include a first conductive type ion implantation layer 143 formed on a second conductive type well 141 or a second conductive type epitaxial layer, and a second conductive type ion implantation layer 145 formed on the first conductive type ion implantation layer 143. For example, as shown in FIG. 1, the P-N junction 140 may be a P0(145)/N-(143)/P-(141) junction, but is not limited thereto. The semiconductor substrate 100 may be a second conductive type, but is not limited thereto.

According to embodiments, the device may be designed to provide a potential difference between the source and drain of the transfer transistor (Tx), thereby enabling the full dumping of photocharges. Thus, as photocharges generated in a photodiode are dumped to a floating diffusion region, the sensitivity of an output image can be enhanced. That is, the electrical junction region 140 may be formed in the first substrate 100 including the readout circuit 120 to provide a potential difference between the source and drain of the transfer transistor (Tx) 121, thereby enabling the full dumping of the photo charges (see FIG. 2). Accordingly, unlike a case where a photodiode is simply connected to an N+ junction such as, for example, in a related image sensor, image sensors in accordance with embodiments can avoid saturation reduction and sensitivity degradation.

A first conductive type connection 147 may be formed between the photodiode and the readout circuit 120 to create a smooth transfer path of photocharges, thereby making it possible to minimize a dark current source and inhibit saturation reduction and sensitivity degradation. For this, in accordance with embodiments, an N+ doping region may be formed as a first conductive type connection 147 for an ohmic contact on the surface of the P0/N−/P− junction 140. The N+ region 147 may be formed to contact N− 143 through the P0 145.

On the other hand, the width of the first conductive type connection 147 may be minimized to inhibit the first conductive type connection 147 from becoming a leakage source. For this, in accordance with embodiments. a plug implant may be performed after etching of a first metal contact 151a, but is not limited thereto. For example, after an ion implantation pattern may be formed, the first conductive type connection 147 may be formed using the ion implantation pattern as an ion implantation mask. In other words, one reason why an N+ doping is locally performed substantially only on a contact formation region as described is to minimize a dark signal and facilitate formation of an ohmic contact. If the entire Tx source region is N+ doped, a dark signal may increase due to an Si surface dangling bond.

Figure 3:
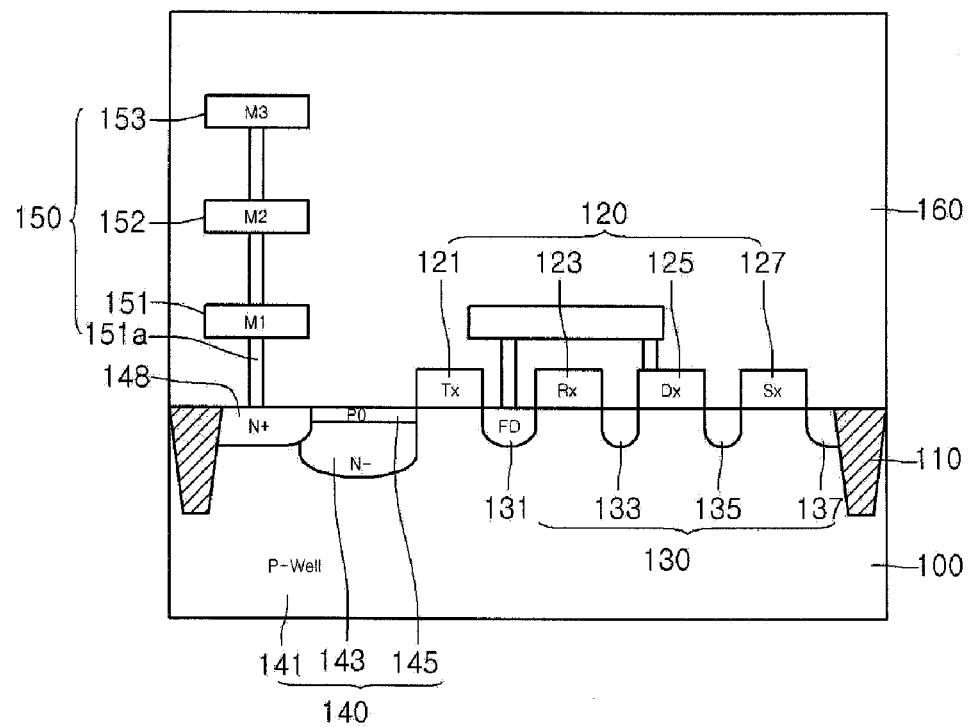

FIG. 3 illustrates another structure of a readout circuit. As shown in FIG. 3, a first conductive type connection 148 may be formed at one side of the electrical junction region 140. Referring to FIG. 3, an N+ connection 148 may be formed at a P0/N−/P− junction 140 for an ohmic contact. In this case, a leakage source may be generated during the formation process of the N+ connection 148 and a M1C contact 151a. This is because an electric field (EF) may be generated over the Si surface due to operation while a reverse bias is applied to P0/N−/P− junction 140. A crystal defect generated during the contact formation process inside the electric field may become a leakage source.

Also, when the N+ connection 148 is formed on the surface of P0/N−/P− junction 140, an electric field may be additionally generated due to N+/P0 junction 148/145. This electric field may also become a leakage source. That is, a layout, in accordance with embodiments, a first contact plug 151a is formed in an active region not doped with a P0 layer but including the N+ connection 148 and is connected to the N-junction 143. Thus, an electric field is not generated over the surface of the semiconductor substrate 100, which can contribute to minimizing of a dark current of a 3D integrated CIS.

Referring again to FIG. 1, the interlayer dielectric 160 and the interconnection 150 may be formed on and/or over the semiconductor substrate 100. The interconnection 150 may include a second metal contact 151a, a first metal (M1) 151, a second metal (M2) 152, and a third metal (M3) 153, but embodiments are not limited thereto. After formation of the third metal 153, an insulating layer may be deposited to cover the third metal 153 and may be planarized to form the interlayer dielectric 160. Thus, the surface of the interlayer dielectric 160 having a uniform surface profile may be exposed on the semiconductor substrate 100.

Figure 4:
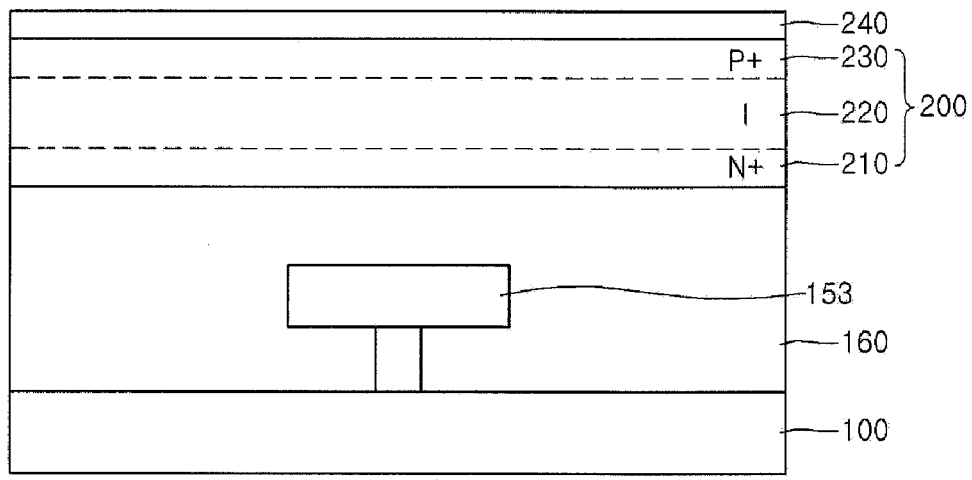

Referring to FIG. 4, an image sensing device 200 may be formed on and/or over interlayer dielectric 160. The image sensing device 200 may be a PIN diode including a first doped layer (N-type) 210, an intrinsic layer (I-type) 220 and a second doped layer (P-type) 230. For example, the first doped layer 210 of the image sensing device 200 may be formed by ion-implanting N-type impurities into a deep region of a crystalline carrier substrate (not shown). The second doped layer 230 may be formed by ion-implanting P-type impurities into a shallow region thereof. The intrinsic layer 220 may be formed between the first doped layer 210 and the second doped layer 230. In embodiments, the intrinsic layer 220 may be formed to have a greater region than the first and second doped layer 230. In this case, a depletion region may be expanded to increase generation of photoelectrons.

Next, after the first doped layer 210 of a carrier substrate is positioned on and/or over the interlayer dielectric 160, a bonding process is performed to bond the carrier substrate to the semiconductor substrate 100. Thereafter, the carrier substrate on which a hydrogen layer is formed is removed by heat treatment or mechanical impacts to expose the surface of the second doped layer 230 of the image sensing device 200 bonded to the interlayer dielectric 160.

Accordingly, the image sensing device 200 may be formed over the readout circuitry 120, thereby enhancing a fill factor and inhibiting defects of the image sensing device 200. Also, the image sensing device 200 may be bonded to the interlayer dielectric 160 having a uniform surface profile such that physical bonding strength can be maximized.

Figure 5:
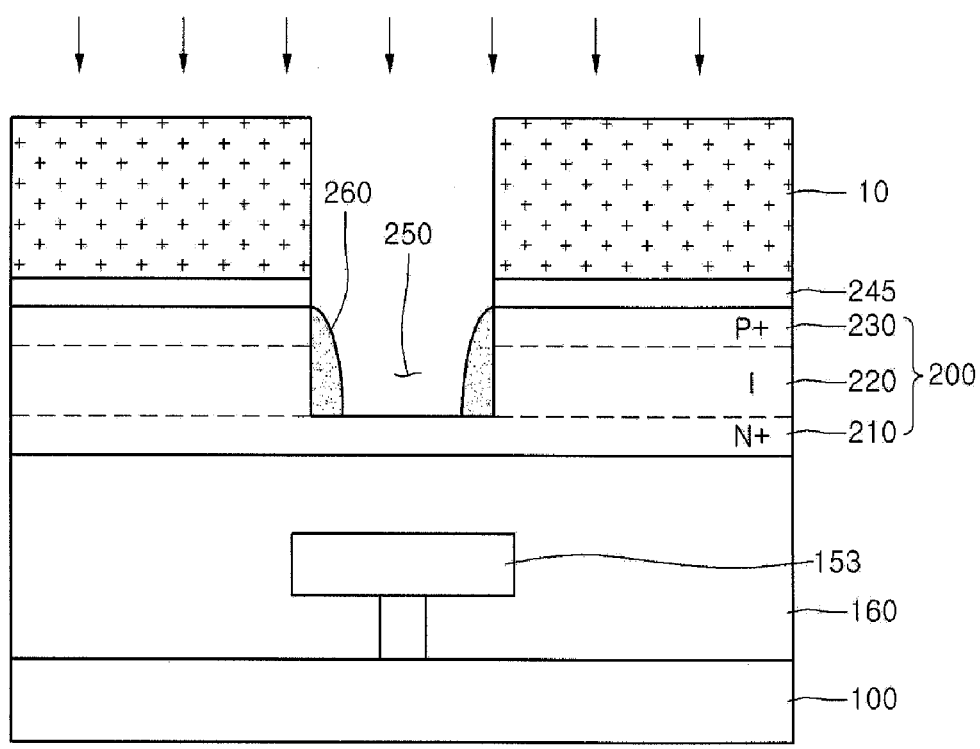

Next, a hard mask layer 240 may be formed on and/or over the image sensing device 200. The hard mask layer 240 may protect the surface of the image sensing device 200. For example, the hard mask layer 240 may be formed of an oxide or a nitride. Referring to FIG. 5, a photoresist pattern may be formed on the hard mask layer 240. The photoresist pattern 10 may selectively expose the hard mask layer 240 corresponding to the third metal 153.

An etching process is performed to a hard mask 245 using the photoresist pattern 10 as an etch mask. The hard mask 245 may expose the image sensing device 200 corresponding to the third metal 153. Although the hard mask 245 is formed, the photoresist pattern 10 may remain due to the etching ratio of the hard mask 245 and the photoresist pattern 10. Next, an etching process may be performed to form a trench 250 using the photoresist pattern 10 and the hard mask 245 as an etch mask. For example, the trench 250 may be formed through an etching process using HBr and Cl2 as an etch gas. The bottom surface of the trench 250 may selectively expose the first doped layer 210 in the image sensing device 200.

That is, the doped layer 210 corresponding to the third metal 153 may be selectively exposed by the bottom surface of the trench 250. Since the trench 250 is extended up to a certain depth of the first doped layer 210, the sidewall of the trench 250 may expose all of the second doped layer 230 and the intrinsic layer 220 and a part of the first doped layer 210.

Also, while the etching process is performed on the image sensing device 200 to form the trench 250, a buffer layer 260 may be formed on the sidewall of the trench 250. The buffer layer 260 may be formed of a polymer that is a by-product generated when the trench 250 is formed. For example, the polymer may have bonding structures such as C—C, C—H, and Cl—C. The buffer layer 260 may formed so as to be attached only to the sidewall of the trench 250 by polymers generated in the etching process in which the photoresist pattern 10 and the hard mask 245 are used as an etch mask. Particularly, a bias voltage may be applied in the formation of the trench 250 to attach polymers only to the sidewall of the trench 250 and thus form the buffer layer 260. Since the buffer layer 260 is selectively formed only on the sidewall of the trench 250, or substantially so, plasma damages can be minimized in the etching process for isolating the first doped layer 210, the intrinsic layer 220, and the second doped layer 230. Also, the buffer layer 260 can minimize a junction stress between the image sensing device 200 and a barrier layer 270 formed in a subsequent process.

Figure 6:
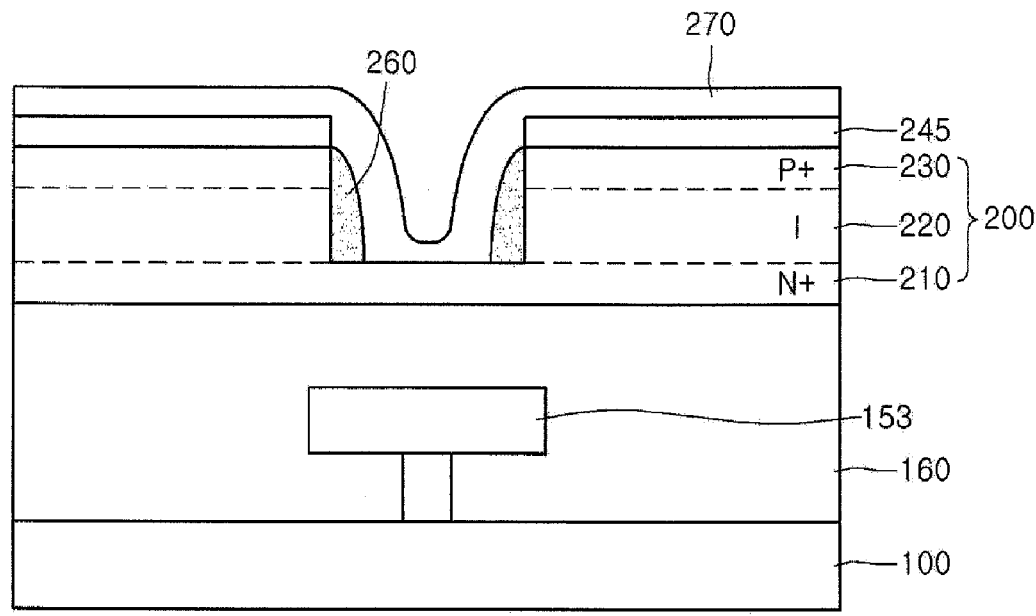

Referring to FIG. 6, the barrier layer 270 is formed along the surface of the hard mask 245 and the image sensing device 200 including the trench 250 and the buffer layer 260. For example, the barrier layer 270 may be formed of an Oxide-Nitride-Oxide (ONO). The barrier layer 270 may be formed in a thin thickness along the bottom surface of the trench 250 and the buffer layer on the sidewall of the trench 250. Since the buffer layer 260 is formed on the sidewall of the trench 250, an interface stress between the barrier layer and the image sensing device 200 can be minimized, thereby improving electrical characteristics.

Figure 7:
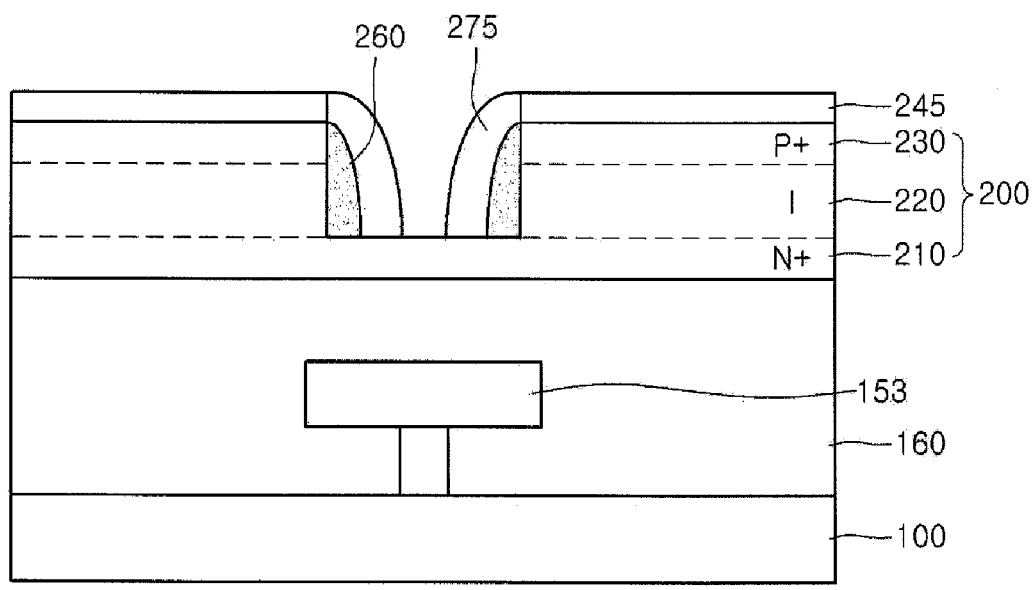

Referring to FIG. 7, a barrier pattern 275 may be formed on and/or over the buffer layer 260. The barrier pattern 275 may be selectively formed only on the buffer layer 260 corresponding to the sidewall of the trench 250 by performing a blanket etch process on the barrier layer 270. Accordingly, the buffer layer 260 and the barrier pattern 275 may be formed on the sidewall of the trench 250, and the first doped layer 210 may be selectively exposed on the bottom surface of the trench 250.

Figure 8:
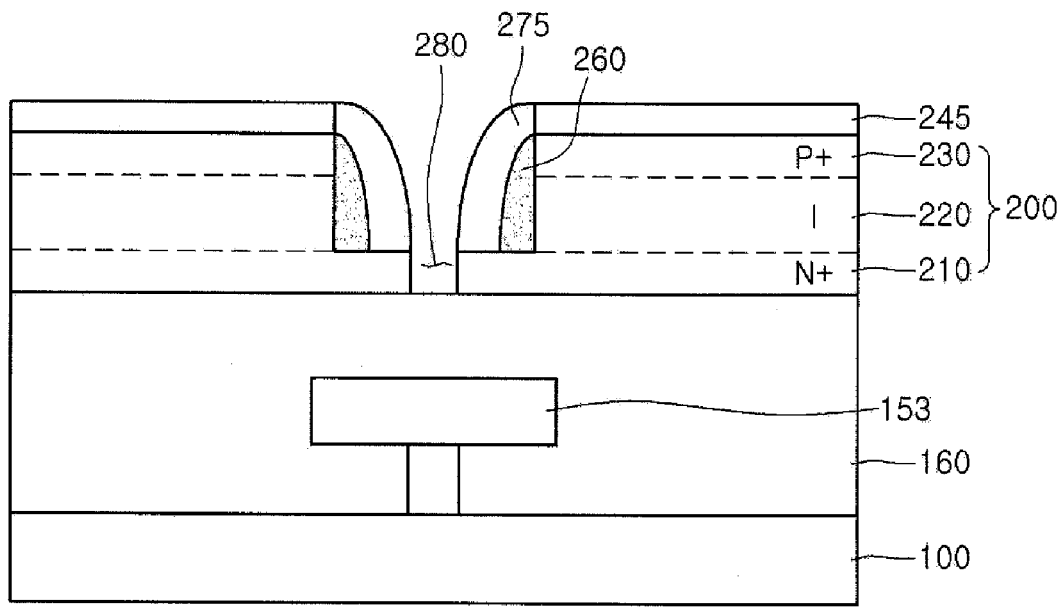

Referring to FIG. 8, a first via hole 280 may be formed through the first doped layer 210 of the image sensing device 200. The first via hole 280 may selectively expose the surface of the interlayer insulating layer 160. For example, the first via hole 280 may be formed through an etching process using the hard mask 245 and the barrier pattern 275 as an etch mask. The first via hole 280 may selectively remove the first doped layer 210 exposed by an etching process using the barrier pattern 275 as an etch mask.

Figure 9:
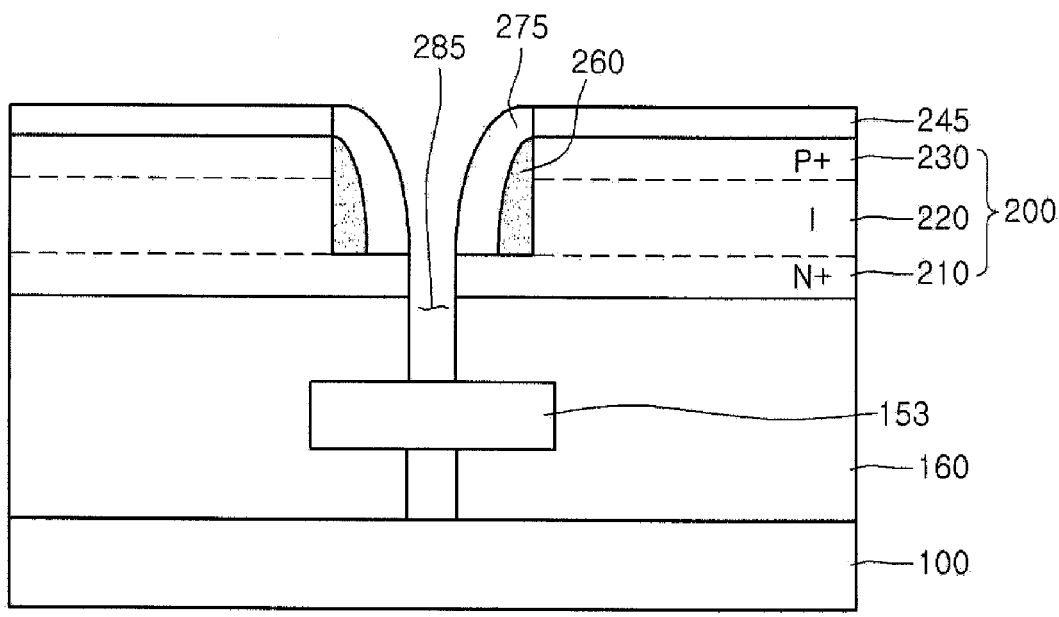

Referring to FIG. 9, the first via hole may be downwardly extended to form a second via hole 285 that exposes the third metal 153. The second via hole 285 may selectively expose the surface of the third metal 153 by penetrating through the interlayer dielectric 160. For example, the second via hole 285 may be formed through an etching process using the hard mask 245 and the barrier pattern 275 as an etch mask. Accordingly, the intrinsic layer 220 and the second doped layer 230 may be covered by the barrier pattern 275, and the first doped layer 210 and the third metal 153 may be exposed by the first via hole 280 and the second via hole 285.

Figure 10:
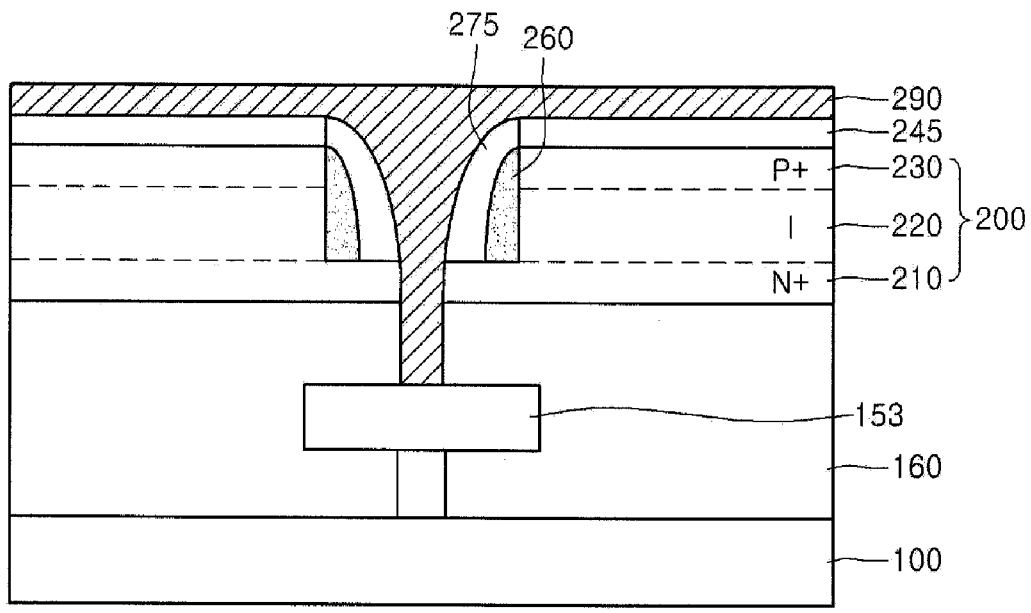

Referring to FIGS. 10 and 11, a metal contact 300 may be formed in the trench 250 and the first and second via holes 280 and 285. The first doped layer 210 may be electrically connected to the readout circuitry 120 through the metal contact 300 and the third interconnection 150. The metal contact 300 may be formed through a planarization process after a metal layer 290 is formed on and/or over the image sensing device 200 to gap-fill the trench 250 and the first and second via holes 280 and 285. For example, the metal contact 300 may be formed of one of metal materials such as W, Al, Ti, Ta/Ti, TiN, Ti/TiN, and Cu.

The metal contact 300 may be formed in the first and second via holes 280 and 285 to be electrically connected to the third metal 153 and the first doped layer 210 of the first doped layer 210. Also, the metal contact 300 may be electrically isolated from the intrinsic layer 220 and the second doped layer 230 of the image sensing device 200 by the buffer layer 260 and the barrier pattern 275. Since the metal contact 300 for delivering photocharges generated in the image sensing device 200 to the readout circuitry 120 is physically and electrically connected only to the first doped layer 210, it is possible for the image sensor to output signals normally. That is, since the metal contact 300 is physically isolated from the intrinsic layer 220 and the second doped layer 230 by the barrier pattern 275 and is electrically connected only to the first doped layer 210, the photodiode can be inhibited from being short-circuited.

The image sensing device 200 may be separated into unit pixels by a pixel isolation layer. Also, an upper electrode, a color filter, and a microlens may be formed over the image sensing device.

According to the embodiments, an image sensing device is formed on a semiconductor substrate in which a readout circuitry is formed, thereby enhancing a fill factor. Signal outputs of photocharges can be normally performed by forming a trench and a via hole through the image sensing device and forming a metal contact in the via hole to deliver electrons of the image sensing device to a readout circuitry. Since a barrier pattern may be formed on the sidewall of the trench such that the metal contact is electrically connected only to a first doped layer of the image sensing device, the image sensing device can be operated as a photodiode.

Also, a buffer layer may be formed on the sidewall of the trench in the formation of the trench for a PIN isolation of the image sensing device, thereby minimizing an interface stress between the barrier pattern and the image sensing device and thus enhancing electrical characteristics such as leakage and resistance. Since an interconnection connected to the readout circuitry can be exposed by an etching process using the barrier pattern as an etch mask, a separate mask is not required, thereby simplifying the process.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a semiconductor substrate comprising a readout circuitry;
   an interconnection and an interlayer dielectric layer over the semiconductor substrate, the interconnection being connected to the readout circuitry;
   an image sensing device over the interlayer dielectric;
   a trench in the image sensing device, the trench corresponding to the interconnection;
   a buffer layer on a sidewall of the trench;
   a barrier pattern over the buffer layer, the barrier pattern selectively exposing a bottom surface of the trench;
   a via hole penetrating through the image sensing device and the interlayer dielectric under the barrier pattern and exposing the interconnection; and
   a metal contact in the via hole.

2. The apparatus of claim 1, wherein the image sensing device comprises a first doped layer, an intrinsic layer, and a second doped layer stacked therein, and the bottom surface of the trench exposes the first doped layer.

3. The apparatus of claim 1, wherein the buffer layer is formed of a polymer.

4. The apparatus of claim 1, wherein the barrier pattern is formed of an Oxide-Nitride-Oxide (ONO) layer.

5. The apparatus of claim 1, comprising:
the interconnection and the interlayer dielectric layer on the semiconductor substrate.

6. The apparatus of claim 1, comprising:
the image sensing device on the interlayer dielectric.

7. The apparatus of claim 1, comprising:
the barrier pattern on the buffer layer.

8. A method, comprising:
forming a readout circuitry in a semiconductor substrate;
forming an interconnection and an interlayer dielectric over the semiconductor substrate, the interconnection being connected to the readout circuitry;
forming an image sensing device over the interlayer dielectric;
forming a mask on the image sensing device, the mask exposing the image sensing device corresponding to the interconnection;
forming a trench in the image sensing device using the mask as an etch mask;
forming a buffer layer on a sidewall of the trench;
forming a barrier pattern over the buffer layer;
forming a via hole exposing the interconnection using the barrier pattern; and
forming a metal contact in the via hole.

9. The method of claim 8, wherein the forming of the trench and the buffer layer comprises:
forming a hard mask layer on the image sensing device;
forming a photoresist pattern on the hard mask layer, the photoresist pattern exposing the hard mask layer corresponding to the interconnection;
forming a hard mask selectively exposing the image sensing device using the photoresist pattern as an etch mask; and
etching the image sensing device using the photoresist pattern and the hard mask as an etch mask, and
the buffer layer is formed by attaching a polymer, which is a by-product generated in the forming of the trench, to the sidewall of the trench;
the buffer layer is formed by attaching a polymer to the sidewall of the trench.

10. The method of claim 9, wherein the polymer is a by-product generated in the forming of the trench.

11. The method of claim 8, wherein a bias voltage is applied in an etching process for forming the buffer layer.

12. The method of claim 8, wherein the forming of the barrier pattern comprises:
forming a barrier layer over the image sensing device along a surface of the trench on which the buffer layer is formed; and
performing a blanket etching process on the barrier layer to expose an upper surface of the image sensing device and a bottom surface of the trench.

13. The method of claim 12, wherein forming the barrier layer over the image sensing device comprises:
forming the barrier layer on the image sensing device along a surface of the trench on which the buffer layer is formed.

14. The method of claim 8, wherein the barrier pattern is formed of ONO layer.

15. The method of claim 8, wherein the image sensing device comprises a first doped layer, an intrinsic layer, and a second doped layer stacked therein, and the bottom surface of the trench exposes the first doped layer.

16. The method of claim 8, wherein an interconnection and an interlayer dielectric layer are formed on the semiconductor substrate.

17. The method of claim 8, wherein the image sensing device is formed on the interlayer dielectric.

18. The method of claim 8, wherein the barrier pattern is formed on the buffer layer.

19. The method of claim 8, wherein forming the buffer layer includes using a polymer.

20. The method of claim 19, wherein the polymer is generated in the forming of the trench.

* * * * *